(12) United States Patent
Ahmed et al.

(10) Patent No.: US 7,493,585 B1
(45) Date of Patent: Feb. 17, 2009

(54) METHODS OF PACKING USER LOGICAL RAM INTO DEDICATED RAM BLOCKS AND DUAL-USE LOGIC/RAM BLOCKS

(75) Inventors: Elias Ahmed, Ottawa (CA); Ketan Padalia, Thornhill (CA)

(73) Assignee: Altera Corporation, San Jose, CA (US)

( * ) Notice: Subject to any disclaimer, the term of this patent is extended or adjusted under 35 U.S.C. 154(b) by 323 days.

(21) Appl. No.: 11/486,564

(22) Filed: Jul. 13, 2006

(51) Int. Cl.
    *G06F 17/50* (2006.01)
(52) U.S. Cl. ...................................... 716/18
(58) Field of Classification Search .............. 716/18
    See application file for complete search history.

(56) References Cited

U.S. PATENT DOCUMENTS

| 6,732,348 B1 * | 5/2004 | Tahoori et al. ............. 716/16 |
| 6,817,006 B1 * | 11/2004 | Wells et al. ............... 716/16 |
| 6,871,328 B1 | 3/2005 | Fung et al. |
| 7,143,376 B1 * | 11/2006 | Eccles ...................... 716/5 |
| 7,171,633 B1 * | 1/2007 | Hwang et al. .............. 716/2 |

\* cited by examiner

*Primary Examiner*—Jack Chiang
*Assistant Examiner*—Brandon W Bowers
(74) *Attorney, Agent, or Firm*—Ropes & Gray LLP; Robert R. Jackson; Regina Sam

(57) ABSTRACT

A method for technology mapping user logical RAM on a programmable logic device is provided. The method preferably includes clustering non-RAM functional block types in the programmable logic device. Following synthesis of a user design, the method then includes determining the number of physical RAM locations available on the selected device. Also, the method includes determining the number of physical RAM locations available in the PLD and the number of Look-Up-Table (LUT) RAM locations available in the PLD. Finally, the method includes determining a combination of physical RAM locations and LUT RAM locations for implementation of the user logical RAM. The combination preferably represents a beneficial combination of physical RAM and LUT RAM with respect to a predetermined metric.

31 Claims, 4 Drawing Sheets

Figure 1 – High Level FPGA CAD Flow

Figure 2 – RAM Balancing Example Using Shared Block Types

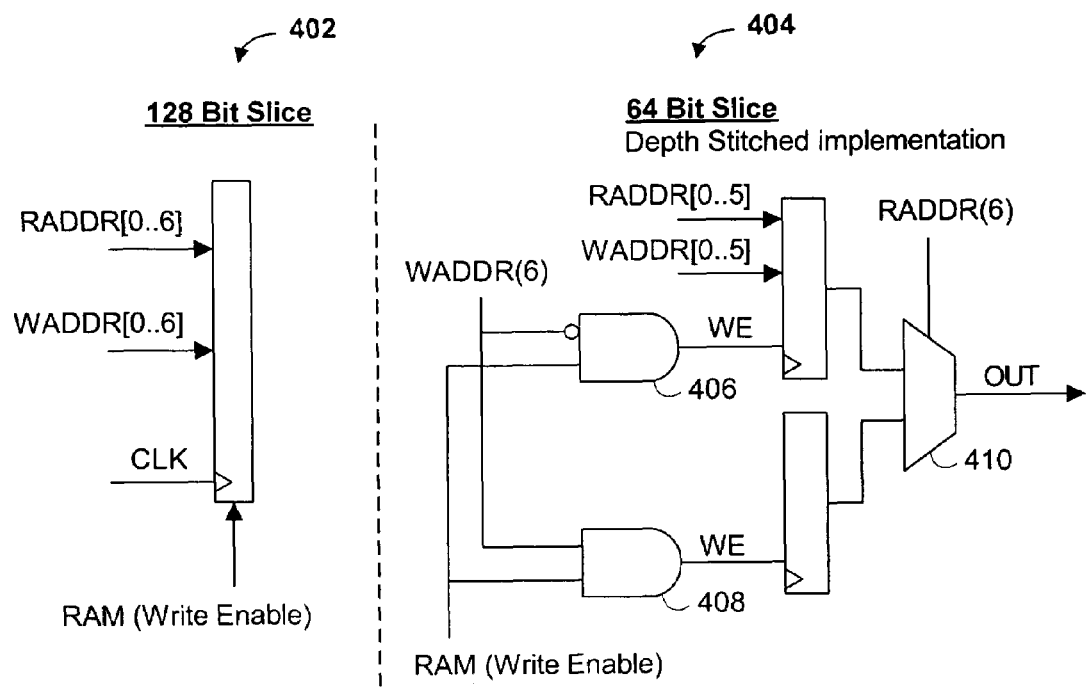
Figure 4 – Detailed flow diagram for RAM clustering and technology re-mapping

METHODS OF PACKING USER LOGICAL RAM INTO DEDICATED RAM BLOCKS AND DUAL-USE LOGIC/RAM BLOCKS

BACKGROUND OF THE INVENTION

The present invention relates to implementing a user logic design in a programmable logic device (PLD or, alternatively, FPGA), and more particularly, the present invention relates to implementing logic design memory in blocks that share logic and memory and physical memory devices of a programmable logic device.

Programmable logic devices are well known. Early programmable logic devices were one-time configurable. For example, configuration may have been achieved by "blowing" (i.e., opening) fusible links. Alternatively, the configuration may have been stored in a programmable read-only memory. Those devices generally provided the user with the ability to configure the devices for "sum-of-products" (or "P TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations. At some point, such devices began to be provided with embedded blocks of random access memory that could be configured by the user to act as random access memory, read-only memory, or logic (such as P TERM logic).

Programmable logic devices are becoming more sophisticated with respect to, for example, the types of memory devices that they provide. This offers users the flexibility of designing logic without the previous limitation of being restricted to implementing that logic using a single type of memory device.

While it may have been possible to program the earliest programmable logic devices manually, simply by determining mentally where various elements should be laid out, it was common even in connection with such earlier devices to provide programming software that allowed a user to lay out logic as desired and then translate that logic into programming for the programmable logic device. With current larger devices, it would be impractical to attempt to lay out the logic without such software.

In certain conventional devices that utilize only physical memory clustering algorithms have typically packed user logical RAMs—i.e., memory requested in the user design or otherwise requested in a suitable design request—into one or more physical RAMs on the PLD. Because these algorithms were based on the devices that had only physical memory types, a single-pass packing algorithm was implemented that populated the physical RAMs by selecting RAM slices one at a time.

Other conventional devices had small, medium, and large physical memories. For these devices, a different clustering algorithm was implemented that automatically optimized the packing of user logical RAMs among the various physical RAMs.

However, all of these conventional devices lacked LUT RAM capability—i.e., the ability to use LUTs to implement user logical RAM. Therefore, no need existed for algorithms that handled balancing logical RAM between physical RAMs and LUT RAM usage.

Yet other tools determined mapping of memory during logic synthesis and then never re-mapped the memory to optimize the memory for a particular implementation.

Furthermore, no known memory mapping algorithms perform optimization on shared blocks of logic and memory following the mapping that occurs during synthesis.

It would be desirable to provide RAM mapping algorithms for shared blocks of memory (that balance between physical RAMs and LUT RAM usage) at later stages of the Computer Aided Design (CAD) flow because RAM mapping at later stages of the CAD flow can take advantage of more accurate information about the device utilization and performance that is obtained following synthesis and make more intelligent mapping decisions.

SUMMARY OF THE INVENTION

It is an object of this invention to provide RAM mapping algorithms for shared blocks of memory at later stages of the Computer Aided Design (CAD) flow because RAM mapping at later stages of the CAD flow can take advantage of more accurate information about the device utilization and performance that is obtained following synthesis and make more intelligent mapping decisions.

This invention includes a method of mapping user logical RAMs into either Look-Up Tables (LUTs) or physical RAM blocks on a programmable logic device (PLD) or balancing user logic RAMs between LUTs and physical RAM blocks. The invention focuses on the efficient usage of block types that can implement both logic and memory—referred to herein for the purposes of this application as shared block types, logic/RAM blocks, or LUT RAMs. An algorithm according to the invention determines optimal mappings of user logical RAMs into either the shared physical block types, the dedicated memory blocks or some combination of the two.

RAM technology mapping during synthesis initially determines how user logical RAMs are implemented. This mapping may be based on estimates of memory and logic usage. This invention preferably performs RAM re-mapping at a later stage of the CAD flow in order to improve density and performance.

A method for technology mapping of a user requested memory on a programmable logic device (PLD), the user requested memory obtained from a user design, is provided. The method is preferably implemented following synthesis of a design on the PLD. The method preferably includes determining the number of physical RAM locations available in the PLD and the number of Look-Up-Table (LUT) RAM locations available in the PLD. The method also includes evaluating the use of a combination of physical RAM locations and LUT RAM locations for implementation of the user requested memory.

The method may also include determining the amount of logic capacity required for logic circuitry in the user design. The method may further include determining the amount of the logic capacity that is available to be used for logic circuitry and the amount of the logic capacity that is available to be used for LUT RAM based at least on the user design and on characteristics of the programmable logic device.

In response to determining the amount of the logic capacity that is available to be used for logic circuitry and the amount of the logic capacity that is available to be used for LUT RAM, the method may determine whether the area required for the amount of the logic capacity that is available to be used for logic circuitry can be reduced by packing the logic circuitry more tightly while maintaining at least one other metric of the programmable logic device within a predetermined degree of tolerance. The method may also iterate the determining the amount of the logic capacity that is available to be used for logic circuitry and the amount of the logic capacity that is available to be used for LUT RAM in order to optimize the balance between logic available for use as LUT RAM and logic available for use as logic circuitry. The iterating may preferably be based on a predetermined metric.

In another embodiment of the invention, the method further includes estimating the amount of logic capacity required for implementation of the user requested memory.

In some embodiments of the invention, the evaluating balances the use of the physical RAM locations and the LUT RAM locations based on the density of the physical RAM locations and LUT RAM locations. Alternatively, the evaluating balances the use of the physical RAM locations and the LUT RAM locations based on a timing performance of the programmable logic device. In yet another alternative embodiment of the invention, the evaluating balances the use of the physical RAM locations and the LUT RAM locations based on power consumption of the programmable logic device. In one final embodiment of the invention, the evaluating balances the use of the physical RAM locations and the LUT RAM locations based on routability of the programmable logic device.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 4 is an example of depth stitching involving 128 bit to 64 bit depth conversion.

DETAILED DESCRIPTION OF THE INVENTION

Figure 1:
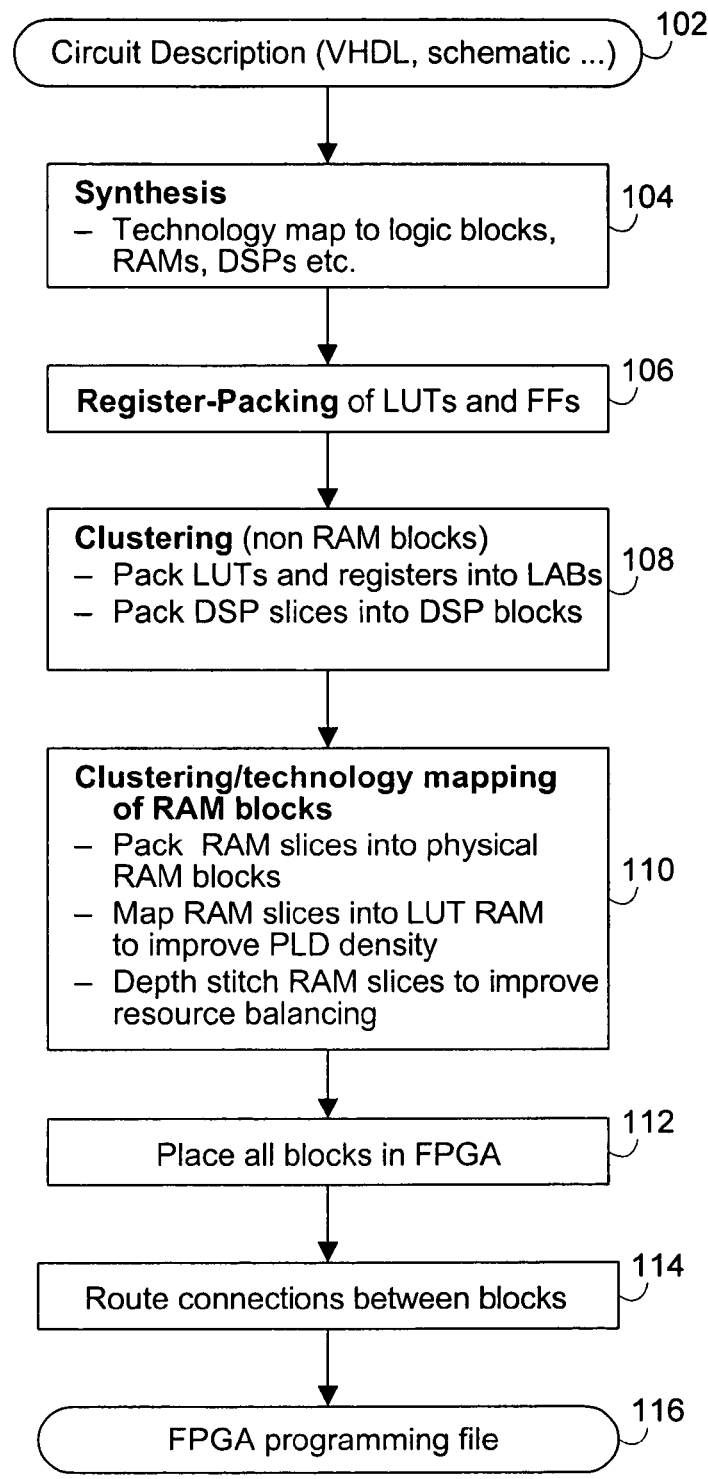
FIG. 1 is a flow diagram of a high level FPGA CAD flow.

The objective of this invention is to optimize the utilization of memory block types that can support shared block types. This invention defines a method for mapping user logical RAMs into multiple types of physical RAMs as well as Look-Up Table (LUT) RAMs. LUT RAM is an example of a shared block type and is defined as a basic functional block that can implement both logic and memory operations.

Most functional blocks are only capable of implementing one type of operation. Such functional blocks which are capable of implementing one type of operation include a register, a logic element, input/output (I/O) or some other type. Other functional blocks, such as a LUT RAM, that have the ability to support multiple operations add complexity to the design flow. This complexity requires additional attention.

Traditionally, the design synthesis determines the mapping of the set of boolean equations representing the user circuit into basic logic elements (BLEs) and other functional blocks like RAMs and DSPs via technology mapping. Synthesis is normally followed by clustering of blocks (also know as packing), then placement and routing. The mapping decisions made during synthesis are usually fixed throughout the flow of the Computer Aided Design.

Such a flow is adequate in most cases when the physical blocks on the PLD support only one type of operation. However, if the PLD architecture has blocks that support multiple operations then the technology mapping generated by synthesis may not be optimal.

This mapping may be less than optimal at least because synthesis occurs early in the design flow at which time very limited information exists about the resource usage on the device. Lacking this information, the system is forced to make estimates on the potential resource usage for each block type. These estimates, which may not accurately reflect the system requirements, then guide the technology mapping phase which selects appropriate functional blocks to implement the user circuit. The quality of the mapping depends on the accuracy of these initial estimates.

This invention proposes algorithms that overcome the deficiencies of LUT RAM technology mapping during synthesis. One algorithm according to the invention preferably maximizes the efficiency of the chip resources in pairing user logical RAMs to physical RAM locations by selecting the appropriate resource types at later stages of the flow (for example during clustering). The algorithm preferably achieves packing efficiency by balancing the resource usage across the device for each circuit that is programmed into the PLD.

One embodiment of the invention performs this by implementing user logical RAMs in either various types of physical RAM, LUT RAM, or a combination of both, depending on the resources demanded by each circuit. This embodiment of the invention preferably decouples RAM synthesis from the rest of the design flow and allows the remainder of the CAD flow to make RAM optimizations independent of the initial RAM mappings produced during synthesis. Furthermore, optimizations based on different part sizes can be made which result in each circuit being able to target a wider range of devices and designs than it otherwise would have.

The invention preferably creates a RAM clustering algorithm that allows for efficient packing of user logical RAMs into either LUT RAM or physical RAM blocks or a combination of both. Furthermore, this invention has the capability to fragment user logical RAMs into smaller components during clustering in order to improve PLD density. In addition, this invention performs netlist modifications—i.e., changes to the logical view of the user's logic design—by re-mapping RAM slices during clustering. These steps behave as a second iteration of technology mapping for RAMs after the initial mapping performed at the time of design synthesis.

FIG. 1 presents a flow chart 100 which describes a high level FPGA CAD Flow. The RAM clustering step according to the invention at step 110 is shown in the context of the overall FPGA CAD flow.

Step 102 shows that the input to the flow is a user design which can come in various formats such as a hardware description language—e.g., VHDL—or schematic of some suitable type. Step 104 shows that the circuit is then synthesized. Synthesis preferably performs technology independent optimization on the set of boolean equations representing the user design.

Step 104 also includes the initial technology mapping of the design onto the basic functional blocks available on the PLD. Basic functional blocks (or simply functional blocks) are the elementary units of the design such as LUTs, LUT RAM, registers, RAM slices, DSP slices. Step 106 shows register-packing of LUTs and Flip Flops (FFs).

After the completion of synthesis the design is now represented as a series of functional blocks. Synthesis preferably does not generate LUT RAM functional blocks according to the invention; only RAM clustering, at a later point in CAD flow, can create them. Clustering shown in 108 then groups preferably all non-RAM functional blocks to create clusters. These clusters are placed in physical functional blocks (or simply physical blocks) on the PLD. These physical blocks are actual physical block locations on the chip such as LABs (Logic Array Blocks), SEABs (Small-sized Embedded Array Blocks), MEABs (Medium-sized Embedded Array Blocks), Mega-RAM and DSP blocks.

After preferably all non-RAM functional blocks have been clustered, RAM clustering and the second phase of RAM technology-mapping are preferably invoked substantially concurrently in step 110. RAM clustering operates on the functional blocks called RAM slices which are the narrowest width implementation of user memories. For example, a 1 K×16 user RAM will be represented as 16 slices that are 1 K bits each in depth.

RAM packing preferably occurs after all other block types have been clustered. Before actual packing commences, the clustering algorithm according to the invention calculates the number of physical block types available for RAM packing. This not only includes all dedicated RAM blocks such as SEABs, MEABs and M-RAMs but also any LABs that can support both logic and memory types.

Clustering then preferably performs a feasibility driven clustering, including mapping and packing of user RAM slices to the target physical RAM locations. During this process, some parts of the design that were initially technology mapped to a RAM slice may be remapped to a LUT RAM. Clustering performs this function if it results in improved density and a smaller chip area. An example of such a scenario that allows for remapping to LUT RAM is for a design that is RAM limited for a given device (the definition of RAM limited is that the part selected is determined by the amount of user RAM not the logic or any other functional block type).

In order to achieve optimal RAM balancing between physical RAMs and LUT RAMs the clustering may also perform RAM depth stitching on some slices. Depth stitching is the process of fragmenting a deep slice into smaller subcomponents that are multiplexed together such that the sum of the fragments is equivalent to the original slice functionality. Depth stitching is described in more detail below with reference to FIG. 4. The goal of RAM clustering is to successfully pack all user logical RAMs into the smallest available physical space while performing any necessary netlist conversions such as re-mapping RAM slices to LUT RAM or the depth stitching of physical RAM slices. These netlist conversions preferably produce extra basic functional blocks such as registers and LUTs that need to be handled appropriately.

As mentioned earlier, one of the key contributions of this invention is the ability to make efficient use of the shared RAM block types in the device. Given a PLD architecture that contains at least one dedicated physical RAM block and at least one shared RAM block type, this invention outlines an algorithm that minimizes overall area occupied by the design, preferably without compromising performance. A dedicated physical RAM block is one that can only support a single logical block type—e.g., SEABs (small sized embedded array blocks), MEABs (medium-sized embedded array blocks) or M-RAM (Meg-RAM) in StratixII™ produced by Altera Corp. of San Jose, Calif.

Figure 2:
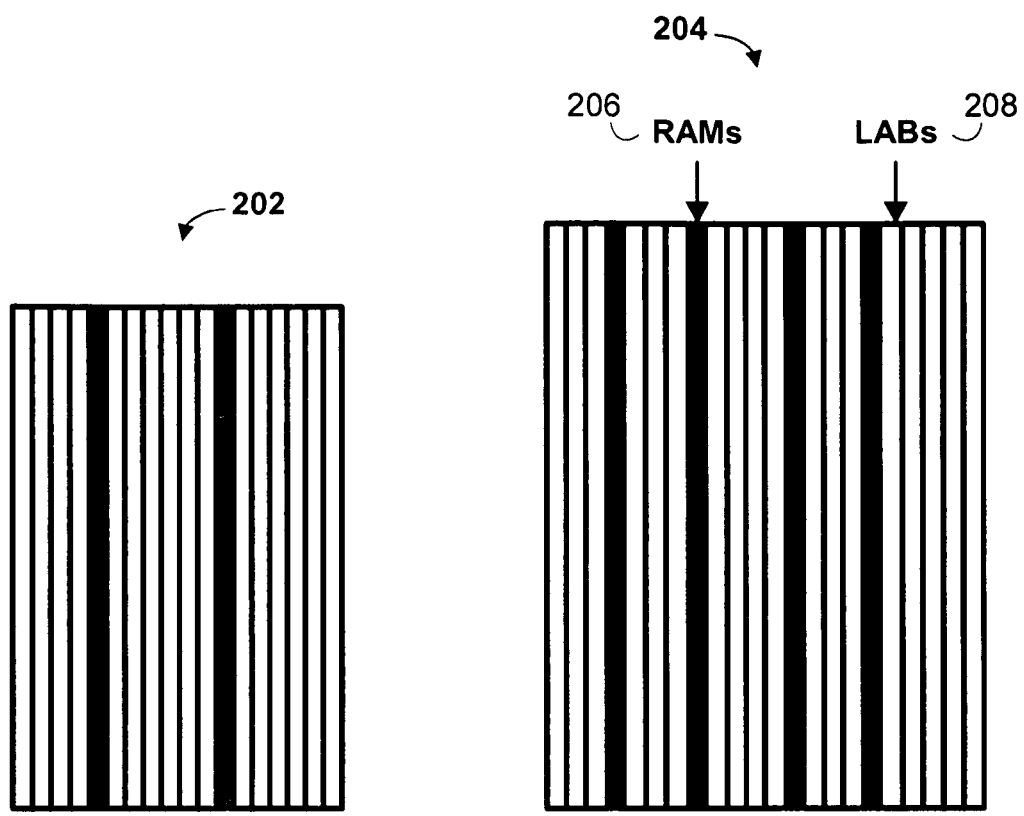
FIG. 2 is a RAM balancing example using shared block types.

To illustrate how shared resources are optimized according to the invention assume an FPGA family with two devices 202 (having capacity of 1000 LABs and 100 RAMs) and 204 (having capacity of 2000 LABs and 300 RAMs) as shown in FIG. 2. Furthermore, it is assumed that two sample designs are provided. The first design (called design A) typically results in 500 LABs and 250 RAM blocks generated after normal clustering without converting RAMs to LUT RAM. The second design (called design B) normally packs in 950 LABs and 30 RAM blocks also without converting RAMs in user logical RAMs into LUT RAM.

Given these two sample designs it is simple to determine that design A can only fit into device 204 in FIG. 2 and design B is able to fit into device 202.

To illustrate how the use and implementation of shared block types are optimized according to the invention the example of design 202 is further examined. This is a RAM limited design that is forced into a larger device despite having low logic utilization; only 25% of logic resources are used (50 LABs of the 2,000 available are utilized). In a method according to this invention, the RAM mapping algorithm preferably identifies this situation and maps some of the RAMs into the available logic space. The objective of the algorithm is to reduce RAM usage, which is the limiting factor, at the cost of increased LAB usage which, in this case, is more available than the RAMs.

By balancing LABs and RAMs it is thus possible to cluster design A into 800 LABs and 100 RAM blocks for example. This new packing configuration means that design A can now fit into smaller device 202.

The above example illustrates how significant area savings can be obtaining by efficiently mapping user logical RAMs into logic. Conversely, cases exist where the algorithm should not map RAMs into logic. Design B presents such a scenario in which the design is limited by the number of LABs. The design requires 950 LABs and is able to just barely fit into the small device 202. The algorithm outlined in this invention further acknowledges that although there is still logic available on the device that can implement memory functions, such an operation may not improve area usage. For example, converting some of the user logical RAM into logic for design B could easily result in the design requiring more than 1000 LABs (the capacity of device 202).

Therefore, one of the major contributions of this invention is the ability to efficiently map user logical RAM onto multiple dedicated physical RAM types as well as shared block types with the focus on optimizing the usage of the shared block types such that area is minimized without sacrificing performance. The remainder of this disclosure describes the algorithms used by the RAM packer to achieve these objectives.

Algorithm Description

Figure 3:
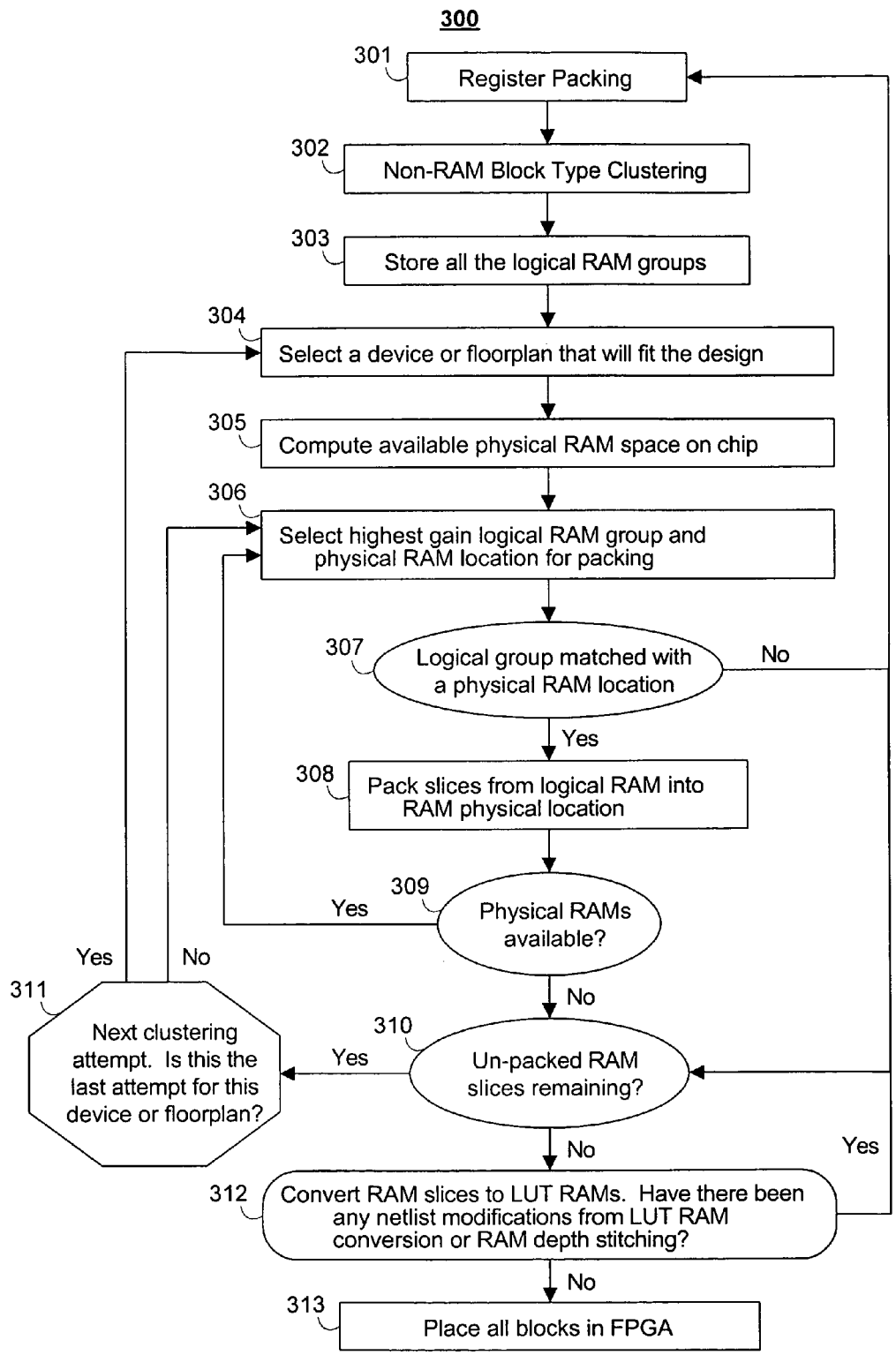
FIG. 3 is a detailed flow diagram for RAM clustering and technology re-mapping.

The details of one embodiment of RAM clustering and technology mapping according to the invention are outlined in FIG. 3. The description of the RAM clustering flow is provided below:

Step 301 shows that register packing occurs after synthesis. One primary goal of register packing is to reduce the number of functional blocks required to implement a given design on a PLD. As stated above, register packing achieves this by combining registers with logic elements and other functional blocks that can support registers, such as multipliers, RAMs and IOs.

Step 302 shows clustering of all non-RAM functional block types. This step is preferably iterated throughout the user design and packs any non-RAM block type into the appropriate physical block type. At this stage all functional block types have been fully clustered except for memories.

Step 303 shows that before proceeding with RAM packing, all the user logical RAM groups or other suitable aggregation of user logical RAM components in the user design should be stored. A set of RAM slices, which may form the component parts of the user logical RAMs, are considered to be logically equivalent if they share the same address and control signals. Such slices can be packed into the same physical RAM location on the chip because they are really a part of the same user logical RAM but just implement different data bits.

Step 304 shows selection of an appropriate device from a given family of programmable logic devices that accommodates all the block types that have been clustered so far. This process preferably selects the smallest possible device into which the given design fits.

Step 305 shows that after an appropriate device has been selected, the algorithm computes or determines the number of physical RAM locations available on that device. This step computes and/or determines the following information for each logical RAM group in the design:

i. The number of physical RAM blocks of each type available that can legally—i.e., within the constraints of the device—support slices belonging to the user logical RAM. There are some constraints on the types of slices that each physical RAM block can support. For example, there are constraints on the maximum depth and mode of the memory—e.g., true dual port or other suitable type of memory—amongst other things. During this phase, preferably all physical blocks that can support memory are accounted for. This includes those blocks that are capable of supporting both logic and memory. The LUT RAM functional block type is an example of this.

ii. The maximum number—i.e., capacity—of slices that a specific physical RAM type can support for the specified logical group.

The next step, as shown in Step 306, is to iterate over all user logical RAMs that still have un-packed slices and select the user logical RAM with the highest attraction (or gain) to a particular physical RAM. Each user logical RAM will have an attraction (expressed by the gain function detailed below) to all the available physical RAMs that can support user logical RAMs of that type. This is further described in following Algorithm 1:

for all user logical RAMs (igroup) {

/* Select physical RAM type that has highest gain for this user logical RAM. */ gain = comput_logical_group_gain_and_best_physical_ram type (igroup, &physical_ram_type);

If (gain > best_gain) { best_gain = gain;

best_physical_ram_type = physical_ram_type; }}

Algorithm 1: This algorithm preferably selects the most attractive physical RAM for each user logical RAM group.

The routine compute-logical_group-gain( ) attempts to select the best physical RAM type for a given user logical RAM. The algorithm is further described below in Algorithm 2. This algorithm favors packing the larger user RAMs over the smaller ones and also accounts for user logical RAMs that failed on previous clustering iterations by giving them a higher gain on future RAM packing attempts. Before computing the gain, this routine preferably calculates the number of available physical RAMs of each type of user logical RAM. It then preferably computes a frequency_ratio for each physical RAM type. For example, assume the PLD architecture has 3 physical RAM blocks called ram_type_A, ram_type_B and ram_type_C which have 1, 100 and 200 instances on the chip. The inverse frequency matrix for this configuration would be the following:

ram_type_A: 200 ram_type_B: 2 ram_type_C: 1

This matrix is then used to calculate the gain function. This frequency matrix is preferably updated after each slice is packed. Therefore the frequency matrix always represents the "current" packing situation and the values change dynamically as clustering progresses. This allows the RAM packer to make intelligent decisions about how to balance slices of user logical RAM between physical RAMs and LUT RAM. From Algorithm 2 (below), the gain for each physical RAM type is expressed by the equation:

location_type_gain = –1.0 * num_locations * frequency_ratio [itype];

The frequency_ratio[ ] factor was explained above. The num_locations term represents the number of physical RAM locations that would be required to fit all the remaining unpacked slices belonging to this user logical RAM. The calculation of num_locations depends on how the slices will eventually get packed into the physical RAM. If the slices can fit into the RAM without any depth stitching or LUT RAM conversions, the calculation of num_locations becomes less complicated. Simply divide the number of slices remaining by the number of slices the physical RAM type can support. The algorithm needs to do additional calculations if depth stitching or LUT RAM conversion is required for the given physical RAM. The reason for this is that both of these operations involve netlist manipulations and re-mappings that create new functional blocks. As a result, the packer should preferably account for the extra blocks due to depth stitching and also update the data which stores the number of available LUT RAM physical locations.

Algorithm 2: Code to determine the user logical RAM group gain.

Step 307 in FIG. 3 determines whether the previous step 306 was successful in matching a user logical RAM group and physical RAM location for packing. If it was successful then the procedures for packing the slices into the RAM location are executed. Otherwise, the failure of the previous step to find a logical group to pack may be due to one of the following: a) all slices have already been packed or b) there are still slices left to pack, however, there is no available space. If the failure is because of the latter, then RAM packing preferably attempts an extra clustering iteration with extra gain given to the failed user logical RAM group. RAM clustering is done if there are no more slices of user logical RAM to pack.

Step 308 shows packing the slices of user logical RAM into the physical RAM selected during step 306. This step also preferably includes computing the number of remaining slices and RAM physical locations available for subsequent phases of the algorithm 300 according to the invention.

Step 308 preferably also accounts for the extra physical RAM locations required due to depth stitching and any constraints associated with the packing.

RAM slices are preferably not converted to LUT RAM types or depth stitched during this phase of the algorithm. The algorithm only saves the recommended packing. If a valid clustering solution is obtained then algorithm 300 will proceed with any netlist modifications required in Step 312.

Step 309 checks for available RAM physical locations for the current stage of algorithm 300. If there are still pack-able physical locations remaining, the algorithm returns to step 306 and attempt to find the next most attractive user logical RAM to pack into the remaining physical RAM.

The phase of the algorithm shown in step 310 is preferably reached by one of the following: a) logical group and physical RAM pairing could not be found in step 307 or b) there are no more available physical RAMs on the device. If there are still unpacked slices left, then another clustering iteration or a larger device is required. However, if all slices have been packed, then no more clustering attempts are required since clustering is complete and the algorithm may proceed with the RAM conversions.

Step 311 is reached whenever a failed RAM clustering attempt is encountered. The algorithm marks the last failed user logical RAM group such that it is given more weight for the next clustering iteration. The algorithm 300 attempts 100, or some other suitable number, of clustering iterations before giving up and selecting a larger device.

Step 312 shows that a valid clustering solution has been obtained. The algorithm then converts any RAM slices into LUT RAM functional blocks and performs depth stitching of slices. All the netlist modifications associated with RAM packing are done in this phase.

The process of depth stitching RAM slices is illustrated in FIG. 4.

More specifically, FIG. 4 illustrates an example of the netlist changes required during a typical depth stitching operation. The example shows how a 128 bit RAM slice 402 gets fragmented into 64 bit deep slices 404 so that it may fit into a LUT RAM block.

This depth stitching can also occur for non LUT RAM functional blocks. For example, assume the user design has many deep user logical RAMs that result in a relatively large device being selected. RAM depth stitching may split these RAMs and the end result may be that the design could potentially fit into a smaller device due to better balancing. Although such optimizations can be executed during synthesis it is more effective at later stages of the flow (such as clustering) when more accurate information about resource usage may be obtained.

This operation results in the fragmentation of a slice 402 into many smaller pieces 404 with extra write decode logic 404, 408 and output multiplexer logic 410 which will be implemented as logic cells. If the RAM slice output was registered then the algorithm preferably also add these registers.

Step 312 also processes the conversion of RAM slices into LUT RAMs. This preferably involves the creation of the data input, write, read and output registers since dedicated physical RAM blocks have greater functionality than the RAMs implemented within the logic blocks. This step preferably creates the read and write registers only once per user logical RAM for each slice that has been converted although these registers could be duplicated for slices belonging to the same user logical RAM in order to improve timing at the cost of increased area.

The algorithm then preferably restarts the CAD flow from register packing (Step 301). All previous register packing and clustering decisions are preferably ignored, however, on this second iteration. RAM conversions and further depth stitching is preferably forbidden. Restarting the flow preferably provides a good solution for accommodating all the extra registers and logic created as a result of LUT RAM packing without compromising the quality of results.

Finally, step 313 places and routes the design.

Variations to Algorithm

There many algorithm variations which are listed below:

The device may be chosen during synthesis as opposed to being selected during clustering. Nevertheless, later stages of the flow will have more accurate estimates on devices utilization and can therefore make a more intelligent device selection.

In this invention, the packing of extra logic and registers as a result of LUT RAM packing or depth stitching is solved by performing a second iteration of the flow starting from register packing. It should be noted, however, that there are numerous methods to pack the extra logic cells. One other approach would involve packing the LUT RAMs during clustering by placing the logic cells into empty locations within LABs. This approach preferably does not require an extra iteration of the flow.

Furthermore, this invention can easily be extended to handle the packing of user logical RAMs with various location assignments on the chip. In such situations, the clustering legality checks simply monitor each RAM location constraint and the locations of the physical RAMs to find a legal solution.

Finally, the algorithm according to the invention can easily be extended such that user logical RAMs implemented in LUT RAM could be converted back so that it fits into a physical RAM block. This provides more flexibility in balancing RAMs.

It should be noted that while the embodiments described herein are directed to PLDs, the methods and systems described herein are equally applicable to other logic devices such as structured ASICs (Application Specific Integrated Circuits) or regular ASICs.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement.

Thus it is seen that methods of packing user logical ram into dedicated ram blocks and dual-use logic/ram blocks have been provided. One skilled in the art will appreciate that the present invention can be practiced by other than the described embodiments, which are presented for purposes of illustration and not of limitation, and the present invention is limited only by the claims that follow.

What is claimed is:

1. A method for technology mapping of a user requested memory on a programmable logic device (PLD), the user requested memory obtained from a user design, the method comprising:

following synthesis of a design on the PLD, determining the number of physical RAM locations available in the PLD and the number of Look-Up-Table (LUT) RAM locations available in the PLD; and evaluating the use of a combination of physical RAM locations and LUT RAM locations for implementation of the user requested memory.

2. The method of claim 1 further comprising determining the amount of logic capacity required for logic circuitry in the user design.

3. The method of claim 2 further comprising determining the amount of the logic capacity that is available to be used for logic circuitry and the amount of the logic capacity that is available to be used for LUT RAM, the determining being based at least on the user design and on characteristics of the programmable logic device.

4. The method of claim 3 further comprising, in response to determining the amount of the logic capacity that is available to be used for logic circuitry and the amount of the logic capacity that is available to be used for LUT RAM, determining whether the area required for the amount of the logic capacity that is available to be used for logic circuitry can be reduced by packing the logic circuitry more tightly while maintaining at least one other metric of the programmable logic device within a predetermined degree of tolerance.

5. The method of claim 4 further comprising iterating the determining the amount of the logic capacity that is available to be used for logic circuitry and the amount of the logic capacity that is available to be used for LUT RAM in order to optimize the balance between logic available for use as LUT RAM and logic available for use as logic circuitry, the iterating being based on a predetermined metric.

6. The method of claim 1, further comprising estimating the amount of logic capacity required for implementation of the user requested memory.

7. The method of claim 1 further comprising determining the amount of logic capacity required for logic circuitry in the user design.

8. The method of claim 1 further comprising selecting a suitable portion of the programmable logic device for implementation of the design.

9. The method of claim 1, wherein the evaluating balances the use of the physical RAM locations and the LUT RAM locations based on the density of the physical RAM locations and LUT RAM locations.

10. The method of claim 1 wherein the evaluating balances the use of the physical RAM locations and the LUT RAM locations based on a timing performance of the programmable logic device.

11. The method of claim 1 wherein the evaluating balances the use of the physical RAM locations and the LUT RAM locations based on power consumption of the programmable logic device.

12. The method of claim 1 wherein the evaluating balances the use of the physical RAM locations and the LUT RAM locations based on routability of the programmable logic device.

13. A method for technology mapping of a user requested memory on a programmable logic device (PLD), the user requested memory obtained from a user design, the method comprising:
following synthesis of the design, determining the number of physical RAM locations available in the programmable logic device and the number of Look-Up-Table (LUT) RAM locations available in the programmable logic device; and
balancing a combination of physical RAM locations and LUT RAM locations, the balancing being based on a predetermined metric, the combination being one that implements the user requested memory.

14. The method of claim 13, wherein the balancing a combination of physical RAM locations and LUT RAM locations comprises determining the combination representing the smallest area of physical RAM and LUT RAM to implement the user requested memory.

15. The method of claim 13, wherein the balancing a combination of physical RAM locations and LUT RAM locations comprises reducing the area occupied by the combination of physical RAM and LUT RAM to implement the user requested memory while preserving a specified logic circuitry requirement.

16. The method of claim 13, wherein the balancing comprises balancing the use of the physical RAM locations and the LUT RAM locations based on the density of the physical RAM locations and LUT RAM locations.

17. The method of claim 13, wherein the balancing comprises balancing the use of the physical RAM locations and the LUT RAM locations based on a timing performance of the programmable logic device.

18. The method of claim 13, wherein the balancing comprises balancing the use of the physical RAM locations and the LUT RAM locations based on power consumption of the programmable logic device.

19. The method of claim 13 wherein the balancing balances the use of the physical RAM locations and the LUT RAM locations based on routability of the programmable logic device.

20. A method for technology mapping user logical RAM on a programmable logic device (PLD), the method comprising:
clustering non-RAM functional block types in the programmable logic device;
following synthesis of a user design, determining the number of physical RAM locations available on the PLD;
determining the number of physical RAM locations available in the PLD and the number of Look-Up-Table (LUT) RAM locations available in the PLD; and
determining a combination of physical RAM locations and LUT RAM locations for implementation of the user logical RAM, the combination representing a beneficial combination of physical RAM and LUT RAM with respect to a predetermined metric.

21. The method of claim 20 further comprising determining the amount of logic capacity required for logic circuitry in the user design.

22. The method of claim 21 further comprising determining the amount of the logic capacity that is available to be used for logic circuitry and the amount of the logic capacity that is available to be used for LUT RAM, the determining being based at least on implementation of the user design and on characteristics of the programmable logic device.

23. The method of claim 22 further comprising, in response at least in part to determining the amount of the logic capacity that is available to be used for logic circuitry and the amount of the logic capacity that is available to be used for LUT RAM, determining whether the area required for the amount of the logic capacity that is available to be used for logic circuitry can be reduced by packing the logic circuitry more tightly while maintaining at least one other metric of the programmable logic device within a predetermined specification of the user design.

24. The method of claim 23 further comprising iterating the determining whether the area required for the amount of the logic capacity that is available to be used for logic circuitry can be reduced by packing the logic circuitry more tightly.

25. The method of claim 20 further comprising selecting a suitable programmable logic device for implementation of the user design.

26. The method of claim 20 further comprising selecting a suitable portion of the programmable logic device for implementation of the design.

27. The method of claim 20, further comprising estimating the amount of logic capacity required for implementation of the user requested memory.

28. The method of claim 20, wherein the predetermined metric relates to timing performance of the programmable logic device.

29. The method of claim 20, wherein the predetermined metric relates to power consumption of the programmable logic device.

30. The method of claim 20, wherein the predetermined metric relates to routability of the programmable logic device.

31. A computer readable medium for technology mapping of a user requested memory on a programmable logic device (PLD), the user requested memory obtained from a user design, the medium comprising:

a first program code for determining the number of physical RAM locations available in the PLD and the number of Look-Up-Table (LUT) RAM locations available in the PLD, the determining following synthesis of a design on the PLD; and a second program code for evaluating the use of a combination of physical RAM locations and LUT RAM locations for implementation of the user requested memory.

\* \* \* \* \*